US008772890B2

(12) United States Patent
Kukushkin et al.

(10) Patent No.: US 8,772,890 B2
(45) Date of Patent: Jul. 8, 2014

(54) APPARATUS AND METHOD OF DETECTING ELECTROMAGNETIC RADIATION

(75) Inventors: Igor Kukushkin, Moscow District (RU); Viacheslav Muravev, Smolensk District (RU)

(73) Assignee: Terasense Group, Inc., Torrance, CA (US)

( * ) Notice: Subject to any disclaimer, the term of this patent is extended or adjusted under 35 U.S.C. 154(b) by 1156 days.

(21) Appl. No.: 12/247,096

(22) Filed: Oct. 7, 2008

(65) Prior Publication Data

US 2010/0084630 A1    Apr. 8, 2010

(51) Int. Cl.
*H01L 27/14* (2006.01)

(52) U.S. Cl.
USPC ........................................... 257/428

(58) Field of Classification Search
USPC .......... 257/192, 194, 285, E29.246–E29.253, 257/E21.212–E21.213, 7, 93, 334, 427, 257/444, 446, 491, 663, 713, 262, 368–401, 257/E29.255–E29.313, E21.409–E21.449, 257/E21.334–E21.346, E21.473, 552–562, 257/E29.033, 288, 901, E49.033, 68–71, 257/296–309, 905–908, E21.371, E21.387, 257/E21.403–E21.407, E21.441, E21.445, 257/E21.448–E21.452, 314–326, E27.078, 257/E29.3–E29.309, 20, E21.395, E21.399, 257/552–562, 85, 90, 94, 96, 97, 183, 196, 257/199, 200, E51.01, E21.011, E21.014, 257/E51.015, E33.016, E33.021, E33.027, 257/E33.032, E33.034, E33.048, E31.005, 257/E31.006, E31.007, E31.064, E31.067, 257/E31.08; 257/E29.085, E29.091, 257/E29.097, E29.14, E29.188, E29.315, 257/E23.027, E29.112, E21.086, E21.093, 257/E21.103, E21.116, E21.188, E21.367; 438/167, 172, 48–98, 135, 151, 197, 438/199, 201, 207, 216, 336.1, 371, 370.01
See application file for complete search history.

(56) References Cited

U.S. PATENT DOCUMENTS

| | | | |
|---|---|---|---|
| 5,914,497 A * | 6/1999 | Sherwin | 257/21 |
| 7,019,336 B2 * | 3/2006 | Yamashita et al. | 257/104 |
| 7,859,020 B2 * | 12/2010 | Kikkawa et al. | 257/194 |
| 8,129,748 B2 * | 3/2012 | Uemoto et al. | 257/192 |
| 8,159,667 B2 * | 4/2012 | Kukushkin et al. | 356/326 |
| 2002/0109110 A1 | 8/2002 | Some et al. | |
| 2004/0183019 A1 | 9/2004 | Mandelis et al. | |
| 2006/0214187 A1 * | 9/2006 | Mita et al. | 257/194 |
| 2008/0073719 A1 * | 3/2008 | Fazan et al. | 257/347 |
| 2008/0087915 A1 * | 4/2008 | Uemoto et al. | 257/192 |
| 2008/0128643 A1 | 6/2008 | Mueller et al. | |
| 2010/0308375 A1 * | 12/2010 | Birkhahn | 257/194 |

FOREIGN PATENT DOCUMENTS

JP       2008-534943 A      8/2008

* cited by examiner

*Primary Examiner* — Dao H Nguyen
*Assistant Examiner* — Tram H Nguyen
(74) *Attorney, Agent, or Firm* — Seppo Laine Oy; Joshua P. Wert

(57) ABSTRACT

A high speed and miniature detection system, especially for electromagnetic radiation in the GHz and THz range comprises a semiconductor structure having a 2D charge carrier layer or a quasi 2D charge carrier layer with incorporated single or multiple defects, at least first and second contacts to the charge carrier layer, and a device for measuring photovoltage between the first and second contacts. System operation in various embodiments relies on resonant excitation of plasma waves in the semiconductor structure.

30 Claims, 17 Drawing Sheets

APPARATUS AND METHOD OF DETECTING ELECTROMAGNETIC RADIATION

BACKGROUND

The region of electromagnetic waves lying in the giga-terahertz (THz) frequency range has recently become of increasing interest in various fields of science and technology. In part, such interest is caused by the upcoming need for higher frequency computer communication channels and systems. In addition, large toxic molecules of biological and chemical agents have resonant absorption lines in the THz region, thereby enabling, for example, tomography of different human tissues. Also detection of certain (chemical) weapons and explosives could be accomplished. Other potential applications can encompass detection of structural and other defects in materials, food inspection, and investigation of astronomical objects.

SUMMARY

The following is a summary description of illustrative embodiments of the invention. It is provided as a preface to assist those skilled in the art to more rapidly assimilate the detailed design discussion which ensues and is not intended in any way to limit the scope of the claims which are appended hereto in order to particularly point out the invention.

Embodiments disclosed hereafter provide a new fast, portable, miniature electromagnetic radiation detector based on a resonant excitation of plasmons in semiconductor systems containing two-dimensional (2D) charge carrier (electron or hole) layers with an incorporated defect. The operation frequency of the detector lies in the millimeter/submillimeter ranges (corresponding frequencies between 1 GHz and 10 THz). The device can comprise one or more semiconductor structures that each comprise at least one two-dimensional charged layer (electron or hole) with at least one intentionally incorporated defect and at least two potential contacts to said layer or layers. A "defect" may comprise any inhomogeneity introduced into the two-dimensional charged layer. For example, such a defect could be realized in the following forms: an etched area, a restriction or expansion, metallic coverage, impurity doping, dielectric environment defect, structural defect, etc. In materials with strong anisotropy, charge carriers may be allowed to move in three dimensions, but predominantly move in two dimensions, thus comprising a "quasi" two dimensional charge carrier layer.

Optionally, the device may include apparatus for applying a magnetic field perpendicular to the charge carrier layer and/or a means for tuning the electron density in the charge carrier layer. The radiation to which the device is exposed can be detected by measuring a voltage/current induced by the radiation. Matrix cameras can be easily created on the basis of the disclosed basic detector because of its small size (normally of the order of a few micrometers) and lack of moving components.

An output signal of the measuring device or detector provides information about at least one of the presence of electromagnetic radiation and the intensity of the incident electromagnetic radiation. A detection system embodiment can include matrices of detectors for giving information about the spacial distribution of at least one of the presence of electromagnetic radiation and the intensity of the incident electromagnetic radiation.

An illustrative method of detecting electromagnetic radiation as disclosed hereafter includes the steps of: directing radiation on the device, thereby causing excitation of plasmons in the presence of the electromagnetic radiation; detecting the excitation of said plasmons by measurement of photovoltage or photocurrent related to it; and forming/evaluating the result of said measurement to obtain information about the electromagnetic radiation.

Operation of illustrative embodiments according to the principles hereafter disclosed may further include the following features:

1. Incident electromagnetic radiation is coupled to the potential probes and/or to the two-dimensional charged layer and/or to the antenna structure evaporated on top of the crystal, thereby inducing on them an alternating potential.
2. The alternating potential gives rise to plasma waves, which propagate in the cavity formed by the two-dimensional charged layer.
3. The plasma waves are partially reflected by the defects and resonate in the cavity formed by at least one potential probe and at least one defect and/or in the cavity formed by at least two defects. This generates a complicated oscillating electric field inside the device. The amplitude of this field is determined by the ratio of the cavity size to the wavelength of the plasmons which, in turn, is a function of the radiation frequency, applied magnetic field, and the carrier density in the device.
4. The oscillating electric field inside the device is rectified by non-linear behavior of the device, resulting in a dc voltage between different pairs of potential contacts. The non-linear behavior may be caused by non-linear volt-ampere characteristics of the transition between contact and charged layer and/or by the presence of at least one defect. The amplitude of the measured signal contains information on the intensity of the radiation.

The illustrative detector operation just discussed has been demonstrated in GaAs/AlGaAs quantum-well devices, fabricated in the form of a stripe with two contacts at the ends with a defect or a series of defects introduced across the stripe. The photovoltaic effect produced an easily detectable signal at temperatures up to 200 K. It would appear that embodiments operating at higher temperatures up to and above ambient can be configured according to the principles set forth herein. Successful detector operation of illustrative embodiments has been verified in the frequency span from 1 GHz to 600 GHz.

DETAILED DESCRIPTION

Figure 1:
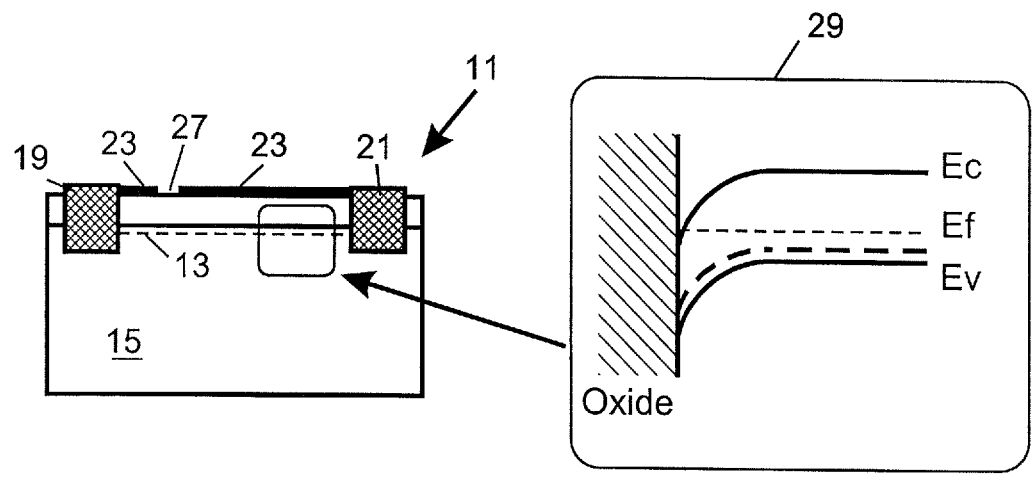
FIG. 1 is a side schematic view of a detector according to an illustrative embodiment.

There has been an increased interest in the behavior of elementary excitations such as plasma excitations (plasmons) in low-dimensional electron systems. The impetus for such interest comes both from scientific interest and the many potential applications in the field of millimeter and submillimeter radiation detection. Plasmons are elementary excitations in solids associated with oscillations in charge density relative to the background of screened impurities. Plasmons in a two-dimensional electron system were first reported and observed in liquid helium in 1976, and later in silicon inversion layers (1977) and GaAs heterostructures (1979). The spectrum of 2D plasmons in the long-wavelength limit ($k_F \gg q \gg w/c$) was calculated as early as in 1967 by Stem as follows:

$$w_p^2(q) = \frac{n_s e^2}{2m^* \varepsilon_0 \varepsilon(q)} q \quad (1)$$

Here, q is the wave vector of the plasmon, while ns and m* are the density and the effective mass of the two-dimensional electrons. The permittivity of vacuum and the effective permittivity of the surrounding medium are denoted as $\in_0$ and $\in(q)$, respectively. The 2D plasmon spectrum possesses two features: (i) it is gapless, i.e., the 2D plasmon frequency approaches zero as q approaches zero, and (ii) the plasmon frequency is perturbed by the geometry and dielectric properties of matter in the immediate vicinity of the 2D electron system via the effective permittivity $\in(q)$ in Equation (1). For instance, for a real case of a silicon MOS (metal-oxide-semiconductor), the 2D plasmon spectrum reads:

$$w_p^2(q) = \frac{n_s e^2}{m^* \varepsilon_0} \frac{q}{\varepsilon_{0X} + \varepsilon_{Si} \coth qd'} \quad (2)$$

where $\in_{OX}$ and $\in_{Si}$ are the effective permittivities of the oxide and silicon layers, and d is the thickness of the oxide layer. For most of the experimentally demonstrated cases in GaAs/AlGaAs heterojunctions and quantum wells $\in(q)=(\in+1)/2$ with $\in=12.6$ being the dielectric constant of GaAs.

When introducing an external perpendicular magnetic field, Eq. (1) no longer describes the plasmon excitations in the two-dimensional electron system and modifications to the plasmon spectrum are bound to occur. The magnetic field evokes plasma waves, which are confined to the edge of the electron system and propagate along the edge in the direction determined by the orientation of the field. The dispersion of these edge-magnetoplasmons has been calculated by Volkov and Mikhailov in 1988 under the assumption of a uniform conductivity tensor across the sample and an abrupt drop in the conductivity at the sample edge:

$$\omega_{emp}(q) \alpha \frac{\sigma_{\infty y}}{2\varepsilon_0 \varepsilon(q)} q \quad (3)$$

The Hall conductivity is denoted as $\sigma_{\infty y}$, $\alpha$ $n_s/B$. Edge magnetoplasmons are observable if the applied magnetic field B satisfies the condition $\omega_c \tau > 1$. Here, $\omega_c$ is the cyclotron frequency.

With respect to embodiments of tunable detectors of electromagnetic radiation, a special device geometry is created. This geometry restricts plasmon propagation to a certain space—plasmonic cavity. If the geometric resonator length amounts to L, then due to interference, only plasma waves with wave numbers $q=m\pi/L$ (m=1, 2, 3 . . . ) are excited. The plasmon frequency may be easily derived from the dispersion laws considered heretofore.

The photovoltaic effect, induced by incident giga-terahertz radiation has been observed in a number of device embodiments. In particular, the illustrative embodiments use two-dimensional electron and/or hole systems, where plasma waves are excited by the incident radiation. For simplicity, an electron system is used below, however it is to be understood that these results apply to a hole system as well. A device family is shown schematically in the FIGS. 1-22.

Figure 2:
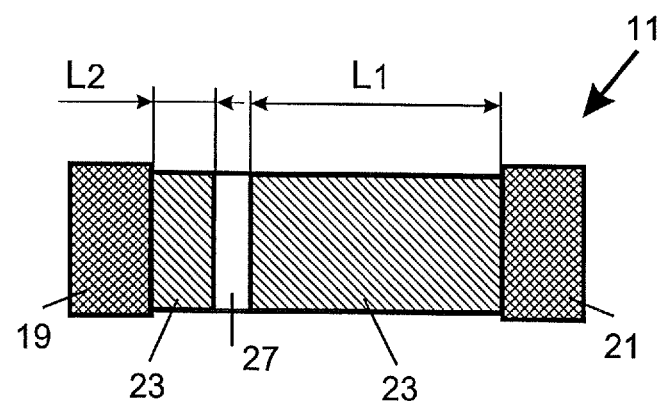
FIG. 2 is a top schematic view of the detector of FIG. 1.
Figure 3:
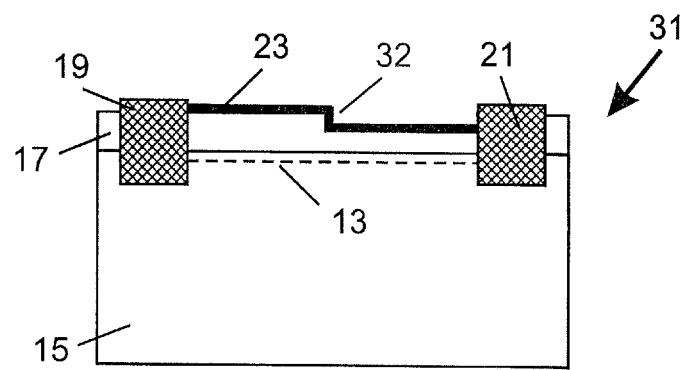
FIG. 3 is a side schematic view of an alternative embodiment.
Figure 4:
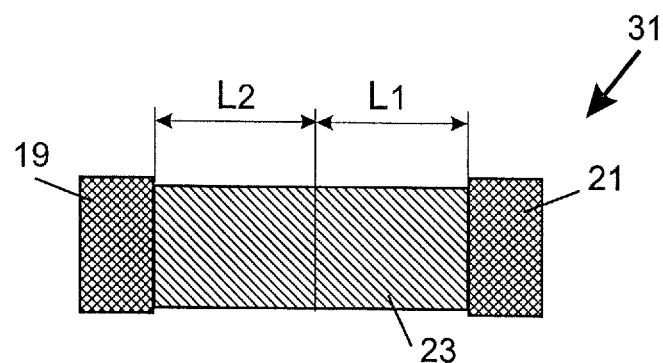
FIG. 4 is a top schematic view of the embodiment of FIG. 3.
Figure 5:
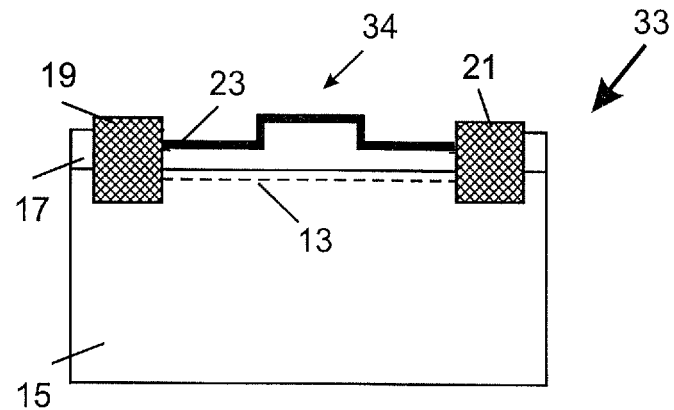
FIG. 5 is a side schematic view of an alternative embodiment.
Figure 6:
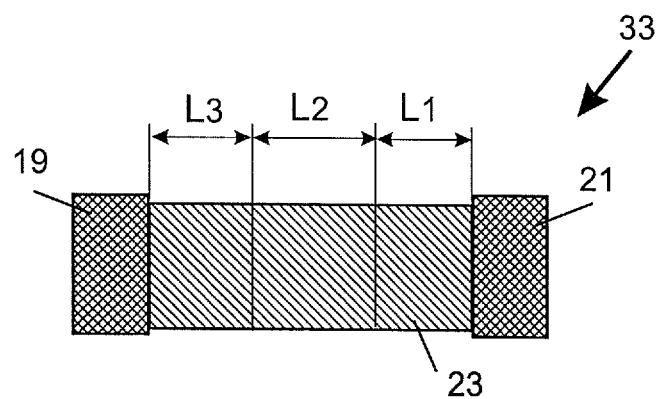
FIG. 6 is a top schematic view of the embodiment of FIG. 5.
Figure 7:
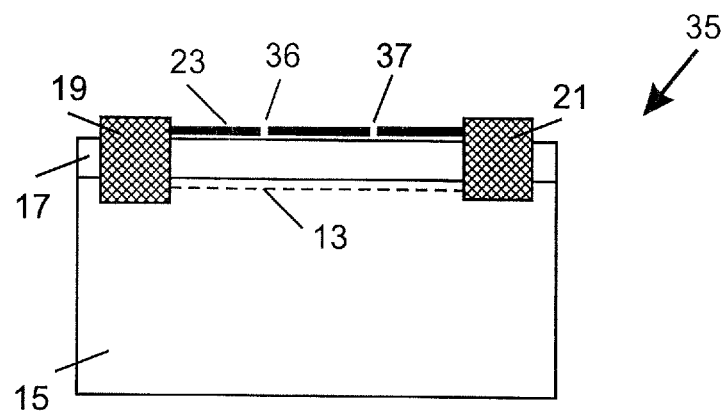
FIG. 7 is a side schematic view of an alternative embodiment.
Figure 8:
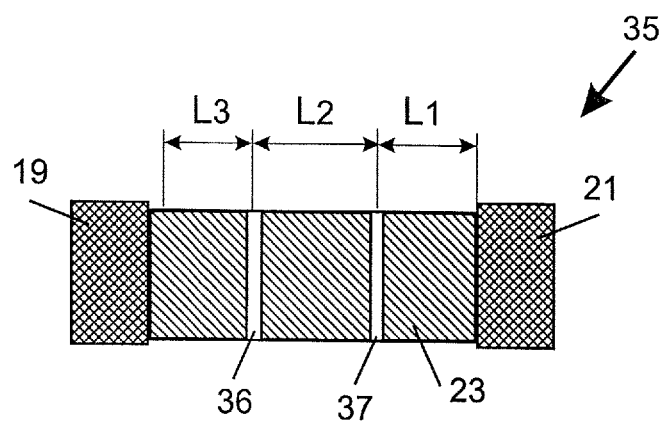
FIG. 8 is a top schematic view of the embodiment of FIG. 7.

FIGS. 1 and 2 show an illustrative device 11 according to an illustrative embodiment. The two-dimensional (2D) electron gas 13 is formed on the interface between the substrate 15 and the barrier layer 17. The electrons are attracted to the interface by the electric field arising from the potential at gates 23. The corresponding energy band diagram 29 is shown at the right of FIG. 1, where $E_f$ represents the Fermi level and $E_c$ and $E_v$ represent the borders of the conduction and valence bands, respectively. In the device 11 of FIGS. 1 and 2, the two-dimensional electron gas 13 is confined in a triangular potential well that is formed on one side due to band banding (banding of electron energy levels) and on the other side by conduction band discontinuity.

The electron system of the device 11 comprises a defect which is formed by the gate slit 27. The width of slit 27 should be of the order of oxide thickness to maintain the device channel. The device 11 terminates at each end in respective contacts 19, 21. The defect 27 and the contacts 19, 21 restrict the regions of the electron system to lengths $L_1$ and $L_2$. Under the incident radiation these regions act as resonant plasmon cavities tuned by the gate potential or/and magnetic field.

Additional embodiments are depicted in FIGS. 3-22. All of these embodiments differ in the number and type of involved defects. For example, the device 31 of FIG. 3 comprises a step-like defect 32, while the device 33 of FIG. 5 includes two step-like defects at 34, demarcating three plasmon cavities of lengths $L_1$, $L_2$, and $L_3$. Finally, the device 35 of FIG. 7 includes two slit-shaped defects 36, 37.

Figure 9:
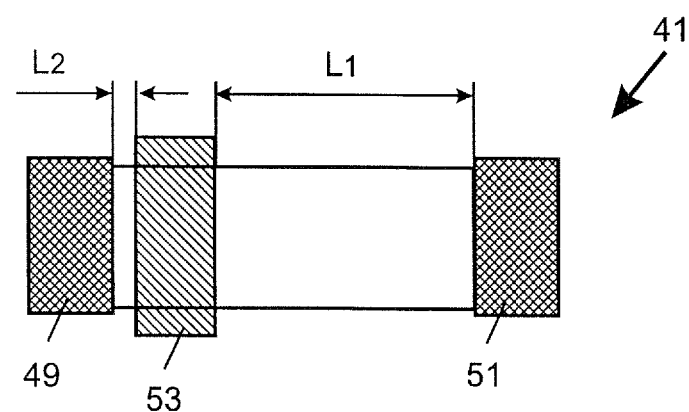
FIG. 9 is a top schematic view of an alternate embodiment comprising a charge layer formed as a heterojunction.
Figure 10:
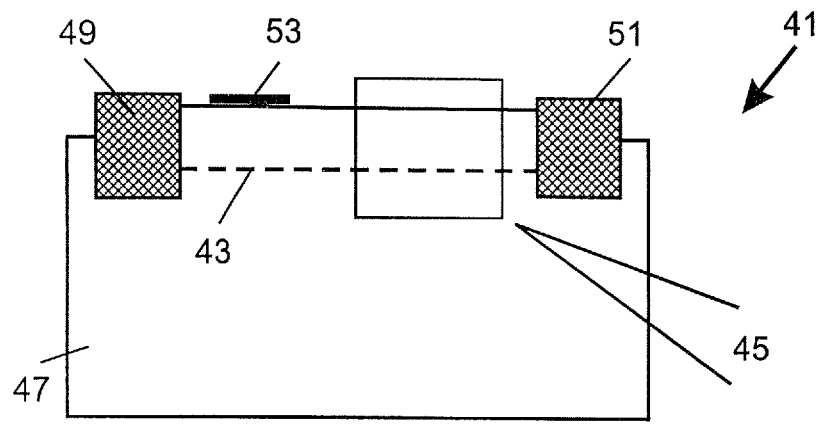
FIG. 10 is a side schematic view of the embodiment of FIG. 9.
Figure 11:
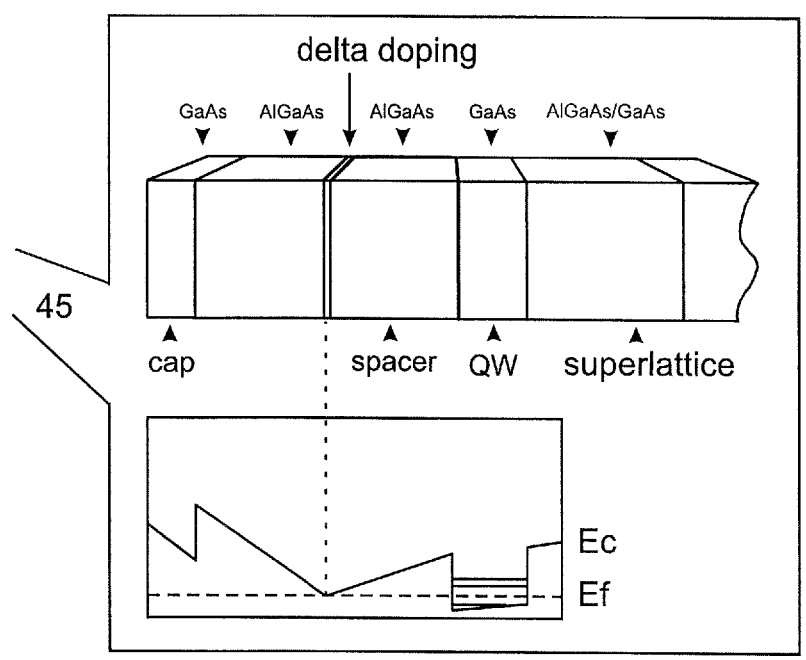
FIG. 11 is an energy band diagram illustrative of one embodiment of a device according to FIGS. 9 and 10.
Figure 12:
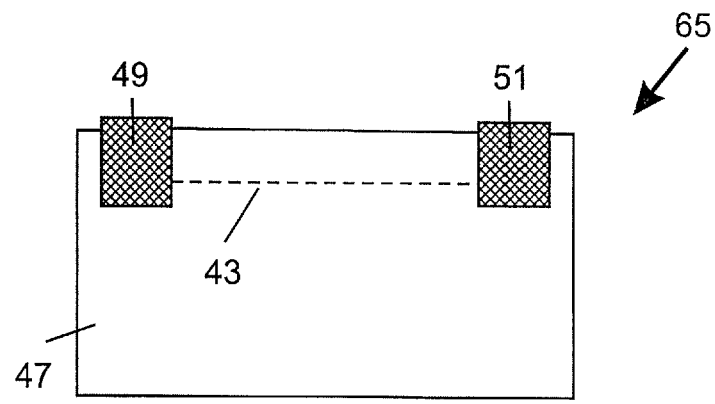
FIG. 12 is a side schematic view of an alternate embodiment comprising a restriction defect.
Figure 13:
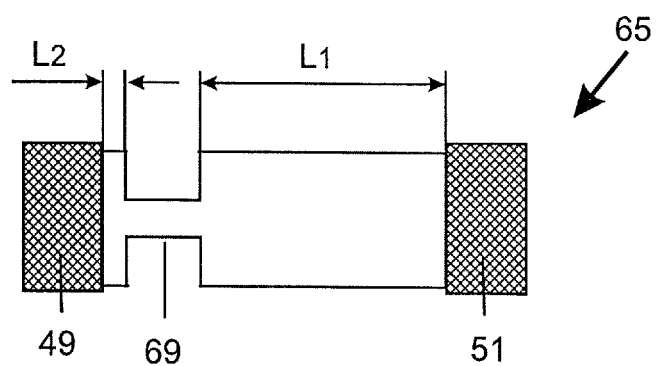
FIG. 13 is a top schematic view of the device of FIG. 12.

FIGS. 9-11 show an alternative embodiment in which the device 41 comprises a charge layer 43 formed as a heterojunction. The device 41 includes a substrate 47, a two-dimensional charge layer 43, and two edge contacts 49, 51. Further, the device 41 includes a single metallic gate defect 53.

As an example, the energy band diagram 45 for the case of AlGaAs/GaAs heterojunction in a device 41 is illustrated in FIG. 11. The two-dimensional electron gas originates in a potential well that is formed at the boundary between materials with different band gaps. As shown in FIG. 11, an illustrative device structure comprises an initial 10 nanometer (nm) region of GaAs; a 50 mm region of $Al_{0036}Go_{0.36}$ As with delta doping; an 18 nm region of Ga As as quantum well; a "superlattice" region of AlAs, $Al_{0.36}Ga_{0.64}$ As and GaAs; and a subsequent region of GaAs substrate.

The photovoltaic effect, induced by incident giga-terahertz radiation has been experimentally observed in a number of device embodiments. The experiments have been performed on a quantum-well GaAs/AlGaAs heterostructure 41 as shown in FIG. 11. The first device embodiment which was verified is further depicted in the inset of FIG. 24. The device comprises a two-dimensional electron layer 43 processed into a stripe geometry with a single metallic gate defect 53. The device geometries were as follows: the stripe width W (0.1 mm and 0.05 mm) and different distances "L" between potential probe 51 and the gate 53 (200 μm, 100 μm, 50 μm, 30 μm, 10 μm). Different gate positions on the stripe 43 were examined, but these cases do not contribute much to physical understanding of device operation. The device response was a combination of signals from two cavities formed by the defect and two subsequent contacts. The density of electrons in the sample was about $n=2\times10^{11}$ cm$^{-2}$ and the low-temperature (4.2 K) mobility about $1\times10^6$ cm$^2$/Vs. The sample was placed either in an oversized 16×8 mm waveguide or in an optical cryostat behind the window. In the case of the cryostat, terahertz radiation was focused at the sample by means of quasi-optical reflectors and lenses. Generators covered the frequency range from 1 GHz to 1 THz with output power levels ranging from 10 to 0.1 mW.

Figure 24:
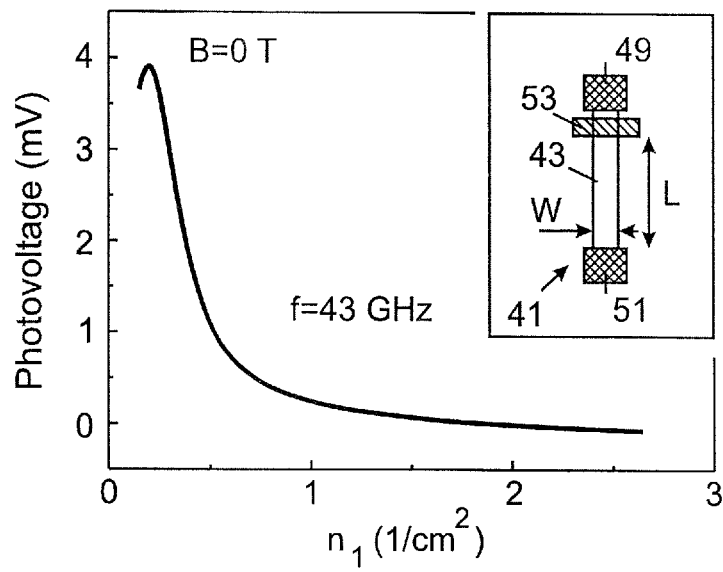
FIG. 24 is a graph of photovoltage vs electron density for an illustrative embodiment of the device of FIG. 10.

FIG. 24 shows the dependence of device signal (mV) on electron density $n_1$ beneath the gate 53 under microwave irradiation with frequency f=43 GHz. Electron density $n_1$ was tuned by applying a voltage to the gate 53, in an experiment carried out in zero magnetic field. The device 41 has the width of W=0.1 mm and the distance L=0.2 mm. It should be noted that, according to Equation (1), at the frequency 43 GHz, the first plasmon mode is excited in the resonance cavity formed between the gate 53 and the potential probe 51.

Figure 25:
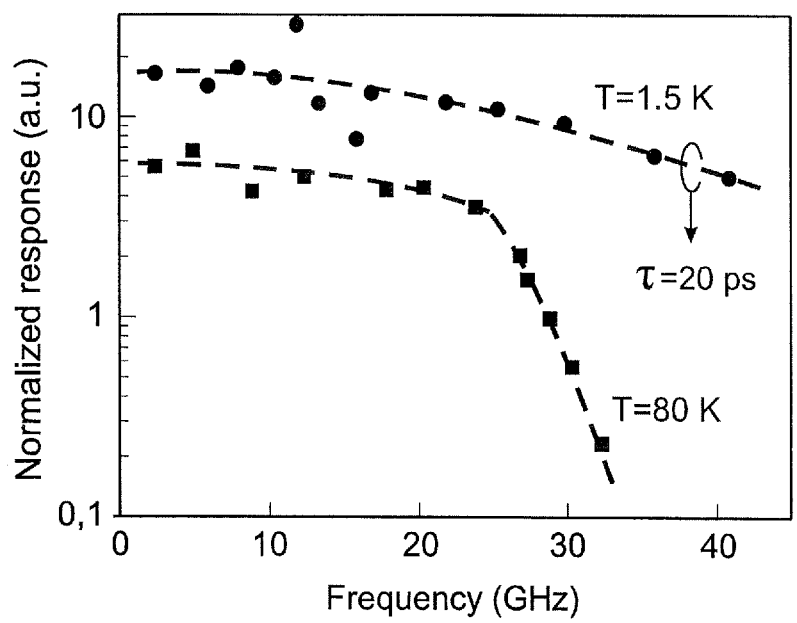
FIG. 25 is a graph depicting mixing measurements (normalized response vs frequency in Giga Hertz) for an illustrative embodiment of the device of FIG. 10.

Turning back to FIG. 24 we see that the device response is greatly affected by the boundary condition formed by the gate defect 53. The detector signal mV is raised several thousand times by changing $n_1$ from $n_1=n=2\times10^{11}$ cm$^{-2}$ to $0.2\times10^{11}$ cm$^{-2}$. From the experimental data, an estimate for the device responsivity R and noise equivalent power N E P has been done with the resultant R=$10^3$ V/W, N E P=$10^{-13}$ W/Hz$^{0.5}$ at an operating temperature of 200 K. These values of R and N E P are comparable to those of commercial GHz-THz detectors such as Schottky diodes, Golay cells, pyroelectric detectors, and microbolometers. However, in comparison to the aforementioned commercial detectors, the disclosed plasma wave detector has an advantage of a much lower response time (up to 10 ps). For example, FIG. 25 illustrates results for mixing measurements on the device 41 with gate defect 53. Radiation from two microwave generators with different frequencies was mixed and directed onto the device. Due to the non-linear response of the device, the output signal comprises a harmonic at the differential frequency of the two generators. The FIG. 25 represents the amplitude of this harmonic versus the differential frequency at two temperatures. The mixing bandwidth amounts to 50 GHz, corresponding to the device response time τ=20 ps.

Figure 26:
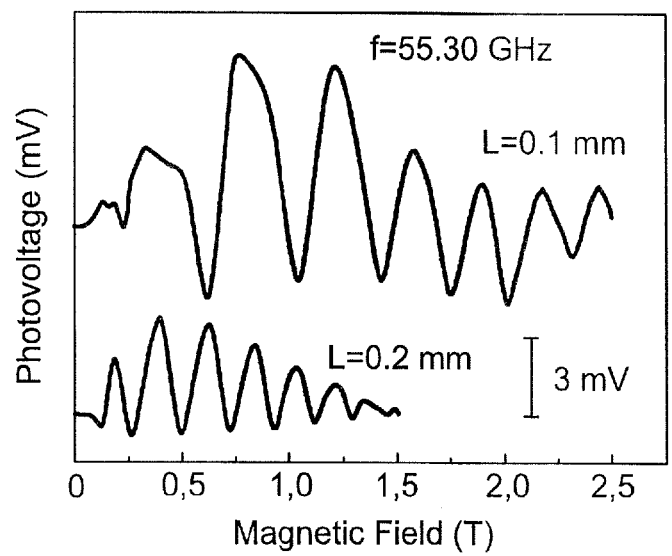
FIG. 26 is a graph of detector voltage vs magnetic field strength.

The resonant frequency of the plasmon cavity could be readily tuned by changing its electron density or/and by applying external magnetic field (see Eq. (1)-Eq. (3)). FIG. 26 displays how the magnetic field (T) influences the device signal (mV). The consequent maximums correspond to the excitation of different plasmon modes with q=(π/L) N (where N=1, 2, . . . being integers) in the cavity. From the figure, it becomes obvious that the cavity size greatly affects the B-spacing between the resonances. This feature confirms the very concept of the plasmon cavity. According to Eq. (3), dispersion of plasma waves in external magnetic field B has the following form:

$$\omega \alpha \frac{n}{B} q$$

The consequent resonances correspond to the excitation of plasmon modes with q (π/L)N (where N=1, 2, . . . being integers). That is, combining with Eq. (3) we get the following expression for the spacing between the adjacent resonances:

$$\Delta B \alpha \frac{n}{L}$$

Figure 27:
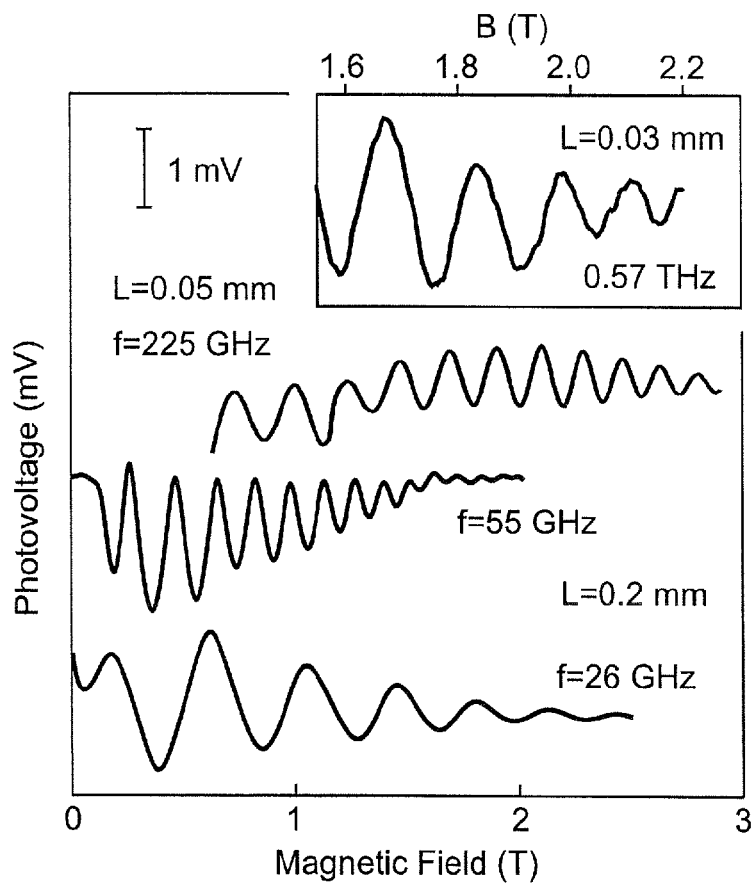
FIG. 27 is a graph of detector voltage vs magnetic field strength.

This formula explains the relation between ΔB and L in FIG. 26. Successful detector operation was verified in the frequency span from 1 GHz to 0.6 THz. In FIG. 27, magnetic field dependent detector signal traces are depicted for different frequencies. First, from FIG. 27 it is apparent that plasmon cavities with different sizes cover different frequency ranges. Second, the higher device operation frequency the smaller the plasmon cavity which is needed. The following table shows experimentally obtained approximate maximum working frequencies F for different plasmon cavity sizes L.

| | Cavity size | | | | |
|---|---|---|---|---|---|
| | L = 400 μm | L = 200 μm | L = 100 μm | L = 50 μm | L = 20 μm |
| Working frequency | <40 GHz | <80 GHz | <140 GHz | <0.25 THz | <0.6 THz |

The table illustrates the fact that terahertz frequencies are achievable with no need for complicated and high cost sub-micron technologies.

Figure 28:
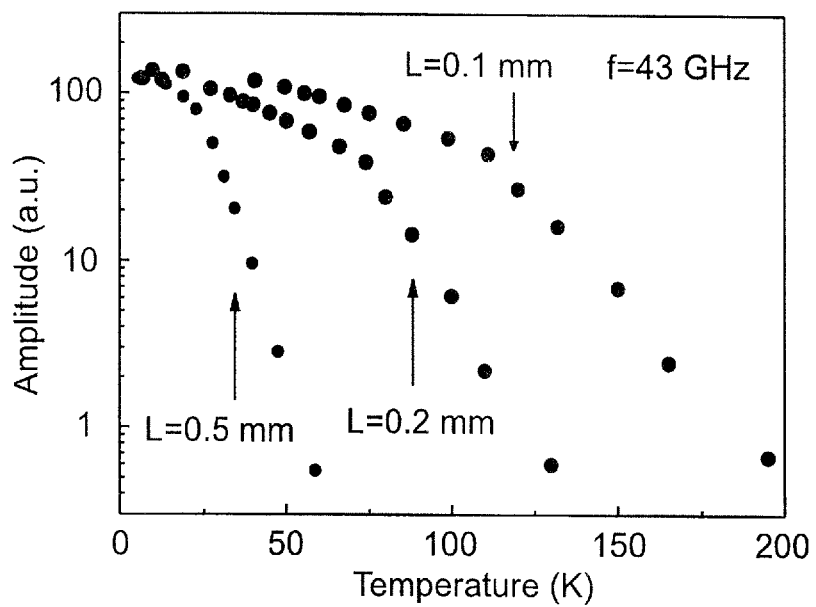
FIG. 28 is a graph of detector signal amplitude vs temperature in degrees Kelvin (K)

All the experiments previously discussed were conducted at a temperature of 4.2 K. The temperature dependencies of the photovoltaic effect for cavities with different sizes is presented in FIG. 28. The experiments were carried out at zero magnetic field when $n_1=1\times10^{11}$ cm$^{-2}$. Plots for different L were scaled up to start from one point at T=4.2 K. In general, the responsivity of the detector drops with temperature increase. However, The signal amplitude is only weakly decreased up to a critical temperature $T_c$ for each cavity size. For example, for L=0.1 mm the critical temperature is $T_c$=125 K, but the signal is still observable even at T=200 K. The depicted signal behavior could be ascribed to decrease of the plasmon coherence length with temperature. An abrupt drop in signal amplitude occurs when the coherence length amounts to the cavity size. From the theoretical point of view (see for example S. A. Mikhailov, Appl. Phys. Lett. 89, 042109 (2006)), the plasmon coherence length depends linearly on the electron concentration. Therefore, an increase in concentration and decrease in cavity size could elevate the operation temperature to ambient point.

Figure 29:
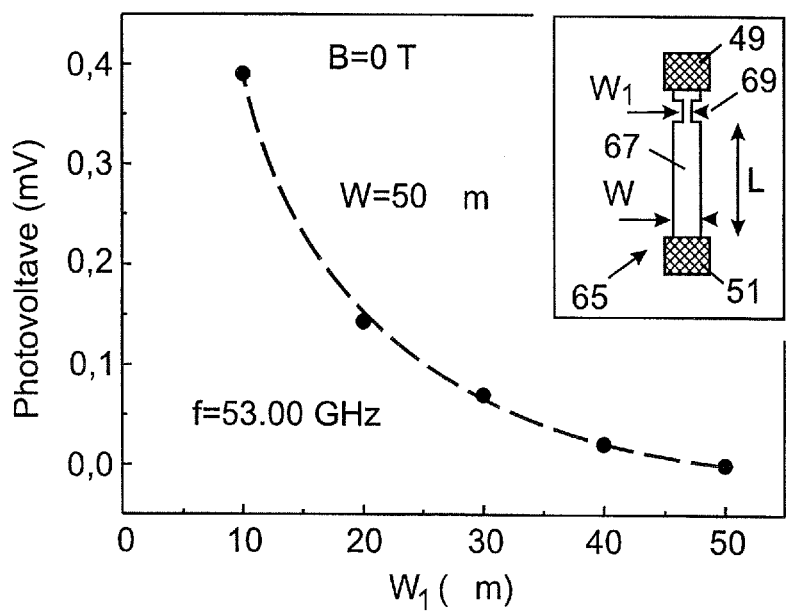
FIG. 29 is a graph of detector voltage vs neck width for illustrative embodiments of the device of FIGS. 12 and 13.

The device embodiment 65 (FIGS. 12, 13) which has been tested experimentally is presented in FIG. 29. The tested structure has a stripe-shape charge layer 67 with incorporated restriction defect 69. Sizes used in the experiment are as follows L=0.15 mm, W=50 μm. The radiation frequency was chosen to satisfy the first plasmon cavity mode condition. The detector signal (mV) at zero magnetic field is greatly affected by the restriction geometry. For the simplest rectangular geometry shown in FIG. 29, the detector signal (mV) is sufficiently raised by decreasing the neck width $W_1$.

Figure 14:
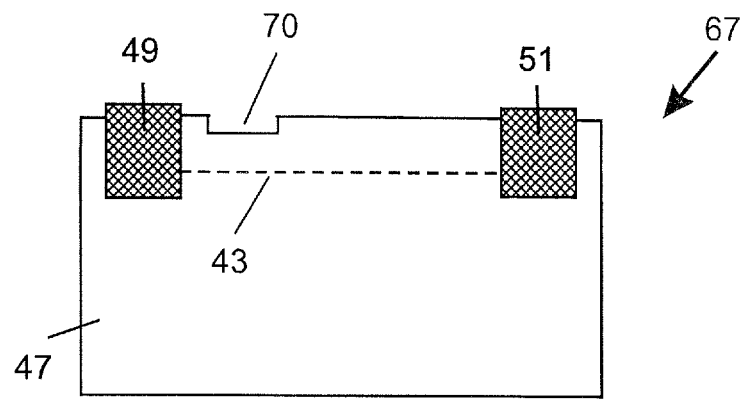
FIG. 14 is a side schematic view of an alternative embodiment comprising an etched area defect.
Figure 15:
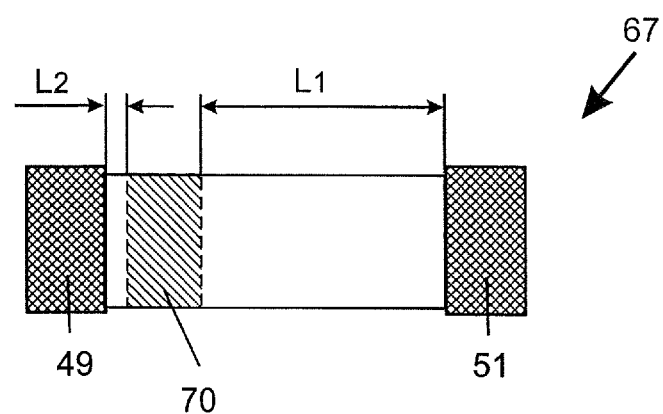
FIG. 15 is a top schematic view of the embodiment of FIG. 14.
Figure 16:
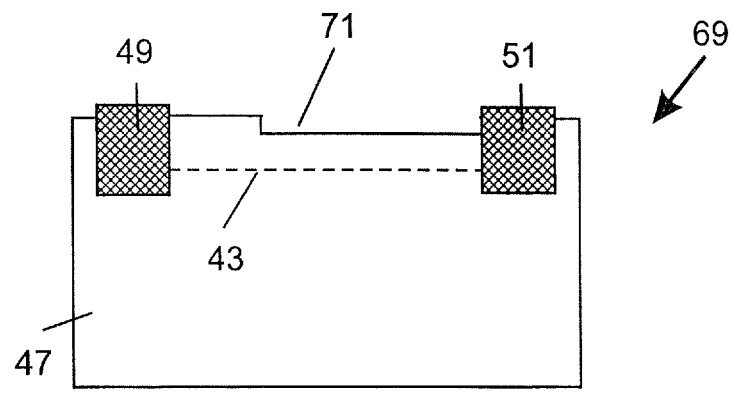
FIG. 16 is a side schematic view of an alternate embodiment comprising a step defect.
Figure 17:
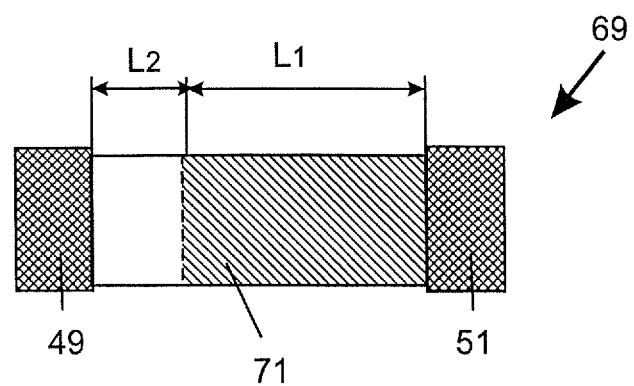
FIG. 17 is a top schematic view of the embodiment of FIG. 16.
Figure 18:
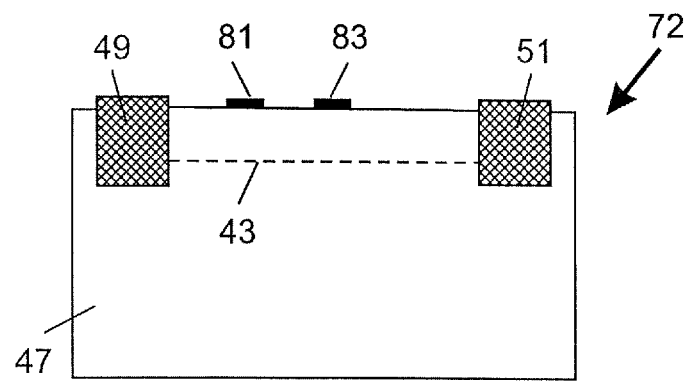
FIG. 18 is a side schematic view of an alternate embodiment comprising two gate defects.
Figure 19:
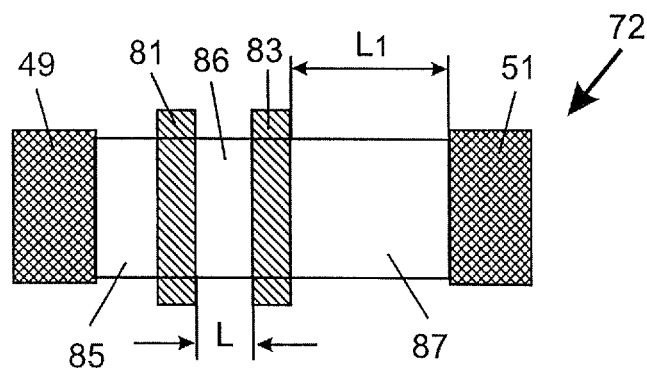
FIG. 19 is a top schematic view of the embodiment of FIG. 18.
Figure 30:
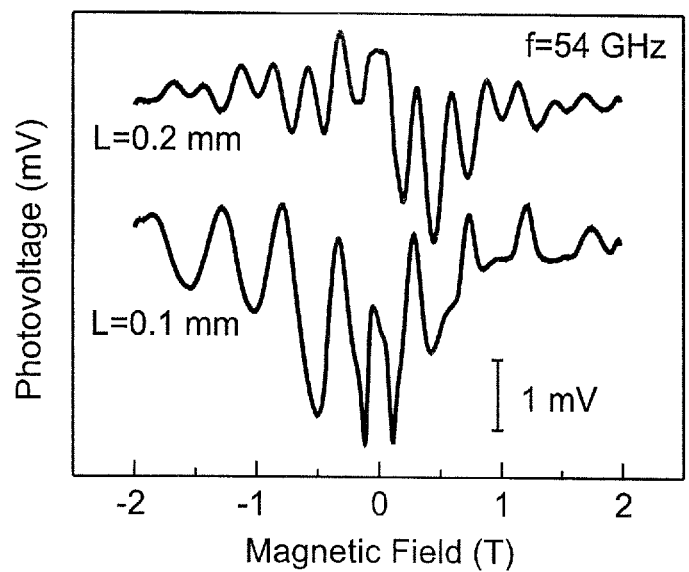
FIG. 30 is a graph of detector voltage vs magnetic field for an illustrative embodiment of the device of FIGS. 14 and 15.

FIG. 30 shows operation of an alternative embodiment in which the device comprises the etched area defect 70 (FIGS. 14, 15). Electron density $n_1$ in the defect area was equal to $n_1=n/2=10^{11}$ cm$^{-2}$. Two geometries have been examined with L=0.2 mm and L=0.1 mm. The device photovoltage displays a magnetic field T tunable resonant response due to the plasmon cavity between contact 51 (??) and defect 70. If the size of the plasmon cavity is doubled, the distance between resonant peaks is decreased two times. This agrees well with Eq. (4) and reflects the plasmon dispersion peculiarities. FIGS. 16 and 17 illustrate an alternate embodiment including a step defect 71.

Figure 31:
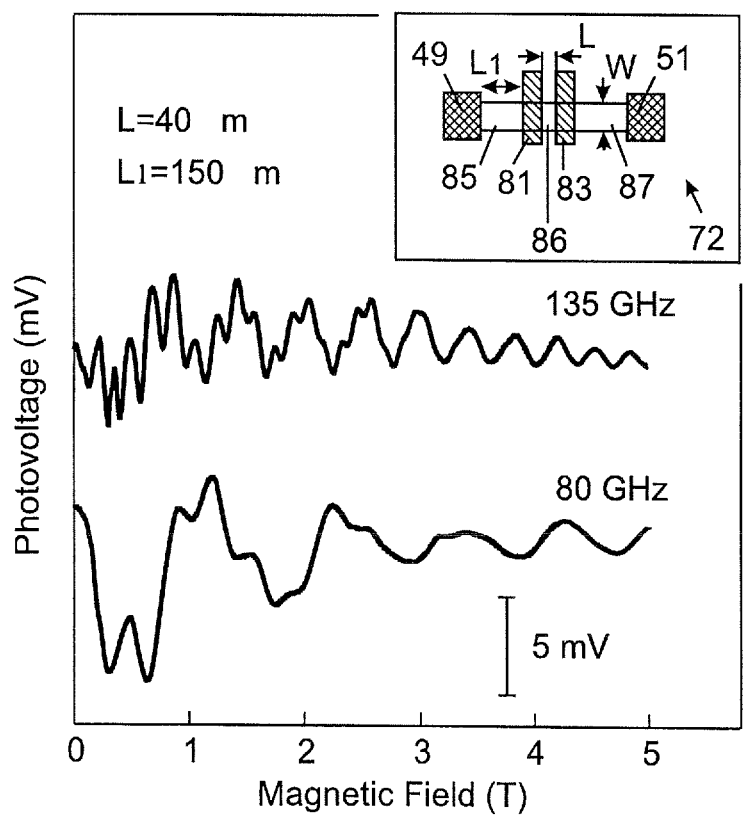
FIG. 31 is a graph of detector voltage vs magnetic field for an illustrative embodiment of the device of FIGS. 18 and 19.

FIG. 31 illustrates the case when two gate defects 81 and 83 (e.g. FIGS. 18, 19) are implemented on a single device 72. The device 72 under consideration has a width of W=50 μm. The length $L_1$=150 μm of the plasmon cavity 85 formed by contact 49 and defect 81 is equal to the length of the second plasmon cavity formed by the other contact 51 and the defect 83. The length of the third plasmon cavity formed by defect 81 and defect 83 is equal to $L_1$=40 μm. The photovoltage device response (FIG. 31) reveals a combination of the signals coming from the three independent plasmon cavities 85, 86 and 87. The device embodiment discussed with respect to FIG. 30 provides an opportunity to measure photo-response from the separate plasmon cavity restricted by two easily-tuned defects, as opposed to a defect and non-tunable contact boundary.

Figure 32:
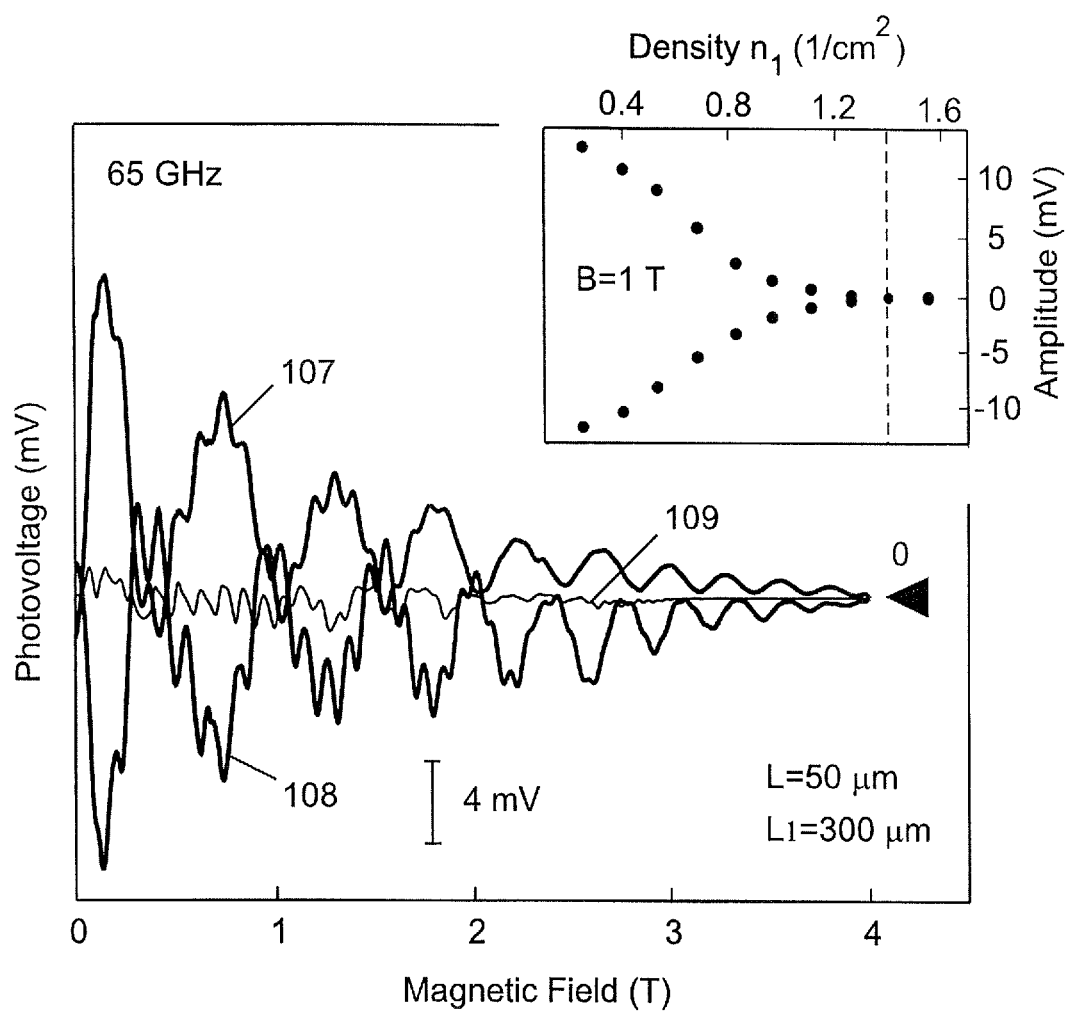
FIG. 32 is a graph of photovoltage vs. magnetic field.

The tunability of the device embodiment of FIG. 31 is well illustrated in FIG. 32, where the device under investigation has the following dimensions to $L_1$=300 μm, L=50 μm and stripe width W=50 μm. The electron density in the device is equal to $n=1.4*10^{11}$ cm$^{-2}$. Curve 107 corresponds to the case when only defect 81 is active, that is a voltage is applied to the gate with respect to contact 49 and the electron density in the defect 81 region equals to $n=1.4*10^{11}$ cm$^{-2}$, and the electron density in the defect 83 region is not changed $n_1$=n. For the curve 108, the opposite situation is realized, only defect 83 is active. The photovoltage device response which originates from the plasmon cavity formed by defects 81 and 83 changes polarity when the active defect is altered. Thus, the device signal symmetry can be easily controlled by the dual gate defects. Curve 109 corresponds to the symmetric case when both defects function. It is apparent that asymmetry introduced into the system greatly increases the device response. The inset to FIG. 32 represents the dependence of photovoltage oscillation amplitude calculated at the magnetic field B=1 Tesla on the electron density under the working gate defect. The upper dots correspond to the active defect 83, and the bottom dots correspond to the active defect 81.

Figure 20:
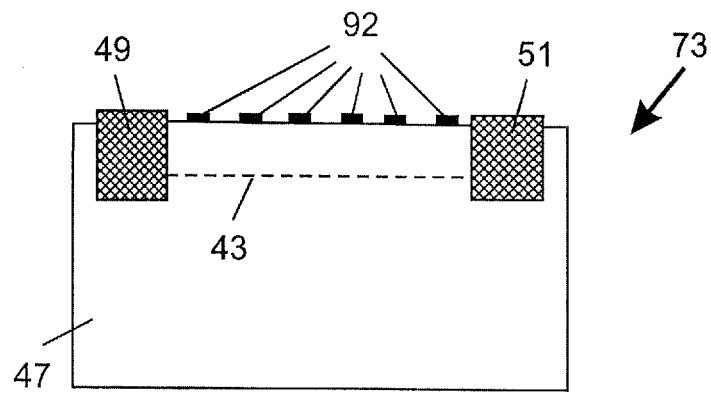
FIG. 20 is a side schematic view of an alternate embodiment comprising six gate defects.
Figure 21:
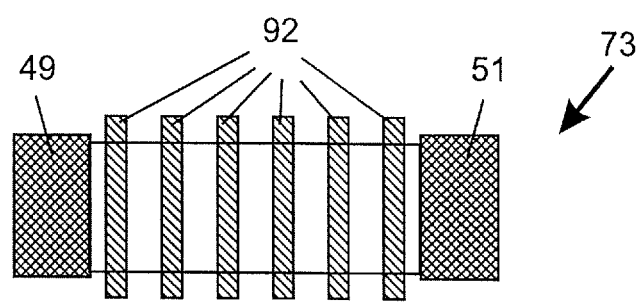
FIG. 21 is a top schematic view of the embodiment of FIG. 20.
Figure 22:
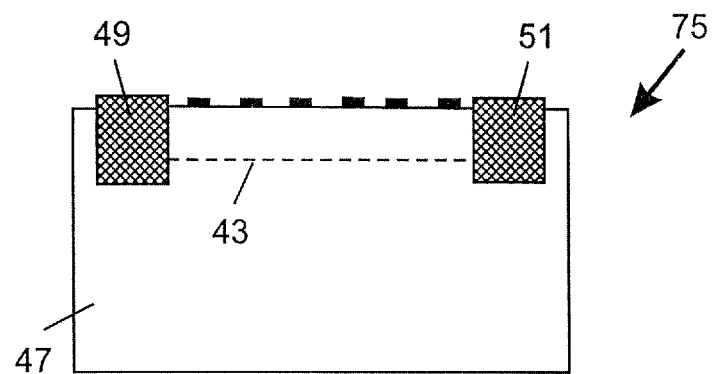
FIG. 22 is a side schematic view of an alternate embodiment employing interleaved defects.
Figure 23:
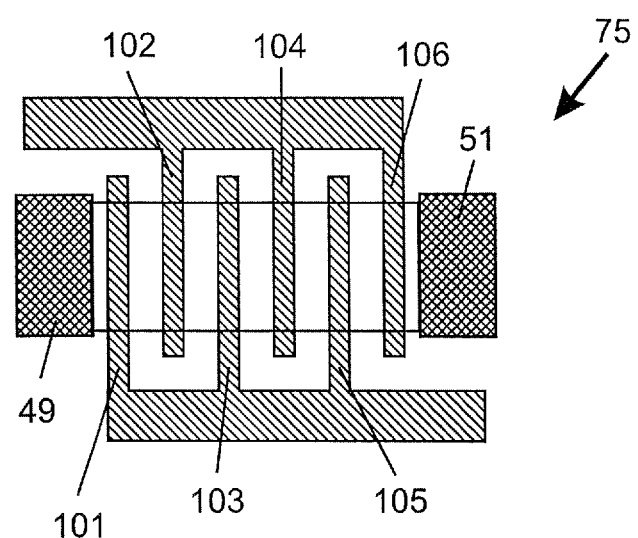
FIG. 23 a top schematic view of the embodiment of FIG. 22.

FIGS. 20 and 21 illustrate a further alternate embodiment employing six gate defects 92, while FIGS. 22 and 23 illustrate an alternate embodiment employing alternating metallization 101, 102, 103, 104, 105, 106 wherein alternating defects are commonly connected.

It should be understood that the experimental data has been set forth only for purposes of clarity and illustration. It is not intended to be exhaustive or to restrict the invention to the precise disclosed examples. While various aspects of the invention have been discussed in terms of an electromagnetic wave detection method, it is understood that the disclosed findings and discoveries apply to all aspects of radiation managing. These aspects encompass generation, mixing, and/or frequency multiplication of radiation having a particular frequency.

Thus, the foregoing description of various embodiments of the invention has been presented for purposes of illustration and description. Therefore, it must be understood that many modifications and variations are possible. Such modifications and variations are intended to be included within the scope of the appended claims.

What we claim is:

1. A solid state detector apparatus comprising:
   a semiconductor structure having a charge carrier layer, wherein charge carriers move in two dimensions (2D);
   at least one defect; and
   at least a first and a second contact defining a length of said charge carrier layer, said contacts being spaced apart by a distance, wherein the at least one defect and at least one of the first and second contacts define at least two length of regions which can act as resonant plasmon cavities.

2. The detector of claim 1 further comprising:
   a measuring device capable of being exposed to an incidental electromagnetic radiation, wherein said measuring device is capable of measuring photovoltage or photocurrent between said first and second contacts, an output signal of said measuring device providing information about at least one of (a) the presence of said incidental electromagnetic radiation, and (b) the intensity of said incident electromagnetic radiation.

3. An apparatus in accordance with claim 1, wherein at least one defect comprises a carrier density inhomogeneity.

4. An apparatus in accordance with claim 3, wherein said density inhomogeneity results from the addition of carriers or impurities, or from the removal of carriers or impurities.

5. An apparatus in accordance with claim 3, wherein said density inhomogeneity is created by adding or removing carriers by applying a gate voltage.

6. An apparatus in accordance with claim 5, including means for varying the amplitude of said gate voltage.

7. An apparatus in accordance with claim 1, wherein said defect comprises a restriction or expansion.

8. An apparatus in accordance with claim 1, wherein said defect comprises an inhomogeneity in a carrier layer.

9. An apparatus in accordance with claim 1, wherein said defect comprises charge carrier layer dielectric environment inhomogeneity.

10. An apparatus in accordance with claim 1, wherein said defect comprises a structural inhomogeneity leading to the carrier effective mass inhomogeneity.

11. An apparatus in accordance with claim 1, wherein a plurality of defects are arranged periodically in space.

12. An apparatus in accordance with claim 1, wherein a plurality of defects are arranged non-periodically in space.

13. An apparatus in accordance with claim 1, wherein plurality of additional contacts to said charge carrier layer are provided in addition to said first and second contacts.

14. An apparatus in accordance with claim 1, including means for varying the amplitude of a magnetic field applied to said apparatus.

15. An apparatus in accordance with claim 1, including means for varying the charge density in said charge carrier layer.

16. An apparatus in accordance with claim 1, wherein said 2D charge carrier layer is an electron layer.

17. An apparatus in accordance with claim 1, wherein said 2D charge carrier layer is a hole layer.

18. An apparatus in accordance with claim 1, wherein said semiconductor structure comprises a GaAs/AlGaAs heterostructure where Ga is gallium, As is arsenic, and Al is aluminum.

19. An apparatus in accordance with claim 1, wherein said semiconductor structure comprises one of a: Si MOSFET structure, an InAs structure, or a Si/Ge structure where Si is silicon, In is indium, As is arsenic, and Ge is germanium.

20. An apparatus in accordance with claim 1, wherein said 2D charge carrier layer or said quasi 2D charge carrier layer is realized in the form of a single quantum well.

21. An apparatus in accordance with claim 1, wherein said 2D charge carrier layer or said quasi 2D charge carrier layer is realized in the form of a double quantum well.

22. An apparatus in accordance with claim 1, wherein said 2D charge carrier layer or said quasi 2D charge carrier layer is realized in the form of a superlattice containing multiple quantum wells.

23. An apparatus in accordance with claim 1, wherein said 2D charge carrier layer or said quasi 2D charge carrier layer is realized in the form of a heterojunction.

24. An apparatus in accordance with claim 1 and comprising a plurality of like detectors formed on one chip.

25. An apparatus of claim 1, further comprising an antenna structure connected to one of said contacts to said change carrier layer.

26. An apparatus in accordance with claim 1 in combination with at least one of a lens, a horn and a waveguide for directing electromagnetic radiation onto said apparatus.

27. An apparatus in accordance with claim 1, further including means for cooling said apparatus to a temperature between ambient temperature and the boiling point of liquid nitrogen.

28. An apparatus in accordance with claim 1 and comprising a plurality of dissimilar detectors formed on one chip.

29. An apparatus according to claim 1 wherein charge carriers are allowed to move in three dimensions due to strong material anisotropy but predominantly move in two dimensions (quasi 2D charge carrier layer).

30. An apparatus according to claim 1, further comprising a barrier layer, wherein the at least one defect and the charge carrier layer are disposed on different sides of the barrier layer.

* * * * *